United States Patent [19]

Venis, Jr.

[11] Patent Number: 4,734,174

[45] Date of Patent: Mar. 29, 1988

[54] ELECTROCHEMICAL FORMATION OF THIN-FILM ELECTRODES

[75] Inventor: Joseph J. Venis, Jr., Hanover, Mass.

[73] Assignee: Polaroid Corporation, Cambridge, Mass.

[21] Appl. No.: 942,865

[22] Filed: Dec. 17, 1986

[51] Int. Cl.$^4$ ................................................. C25F 3/14
[52] U.S. Cl. ............................ 204/129.5; 204/129.85
[58] Field of Search ............ 204/129.5, 129.6, 129.65, 204/129.85, 206, 212, 218, 224 R

[56] References Cited

U.S. PATENT DOCUMENTS

| | | | |
|---|---|---|---|
| 3,239,441 | 3/1966 | Marosi | 204/129.5 |
| 4,116,754 | 9/1978 | Huntley et al. | 156/656 |
| 4,187,340 | 2/1980 | Oishi et al. | 428/210 |
| 4,243,455 | 1/1981 | Shiba et al. | 156/187 |
| 4,344,817 | 8/1982 | Chamberlin | 156/645 |
| 4,399,194 | 8/1983 | Zelez et al. | 428/457 |
| 4,516,836 | 5/1985 | Ferrato | 350/336 |
| 4,608,129 | 8/1986 | Tamamura et al. | 204/18.1 |

FOREIGN PATENT DOCUMENTS 2354264  5/1974  Fed. Rep. of Germany ... 204/129.5

*Primary Examiner*—T. M. Tufariello
*Attorney, Agent, or Firm*—Louis G. Xiarhos

[57] ABSTRACT

An electrode material on a substrate is patterned by forming an electrochemical cell from a pattern-forming master and from a substrate having an electrode starting film formed on a surface thereof. The pattern forming master and the substrate carrying the electrode starting film are brought together with an electrolyte therebetween, to define an electrochemical cell which is connected to an appropriate source of electrical energy to electrolytically remove selected areas of the electrode starting film to form the desired electrode pattern on the finished substrate. In one form, the pattern master includes a patterning surface having photolithographically formed insulated and conductive areas with the insulated areas corresponding to the finished electrode pattern on the substrate. In another form well suited for continuous production techniques, the pattern master is formed as a rotatably mounted cylindrical drum carrying conductive and insulated areas with the latter areas corresponding to the desired electrode pattern. The substrate is provided as an elongated web having an electrode starting film applied to one surface. The pattern master and the web are connected to a suitable source of electrical energy with the pattern master serving as the cathode and the electrode starting film serving as the anode. As the web is advanced into engagement with the surface of the rotating pattern master in the presence of an electrolyte, selected areas of the starting film are electrochemically removed to produce a series of electrode patterns on the substrate web.

19 Claims, 6 Drawing Figures

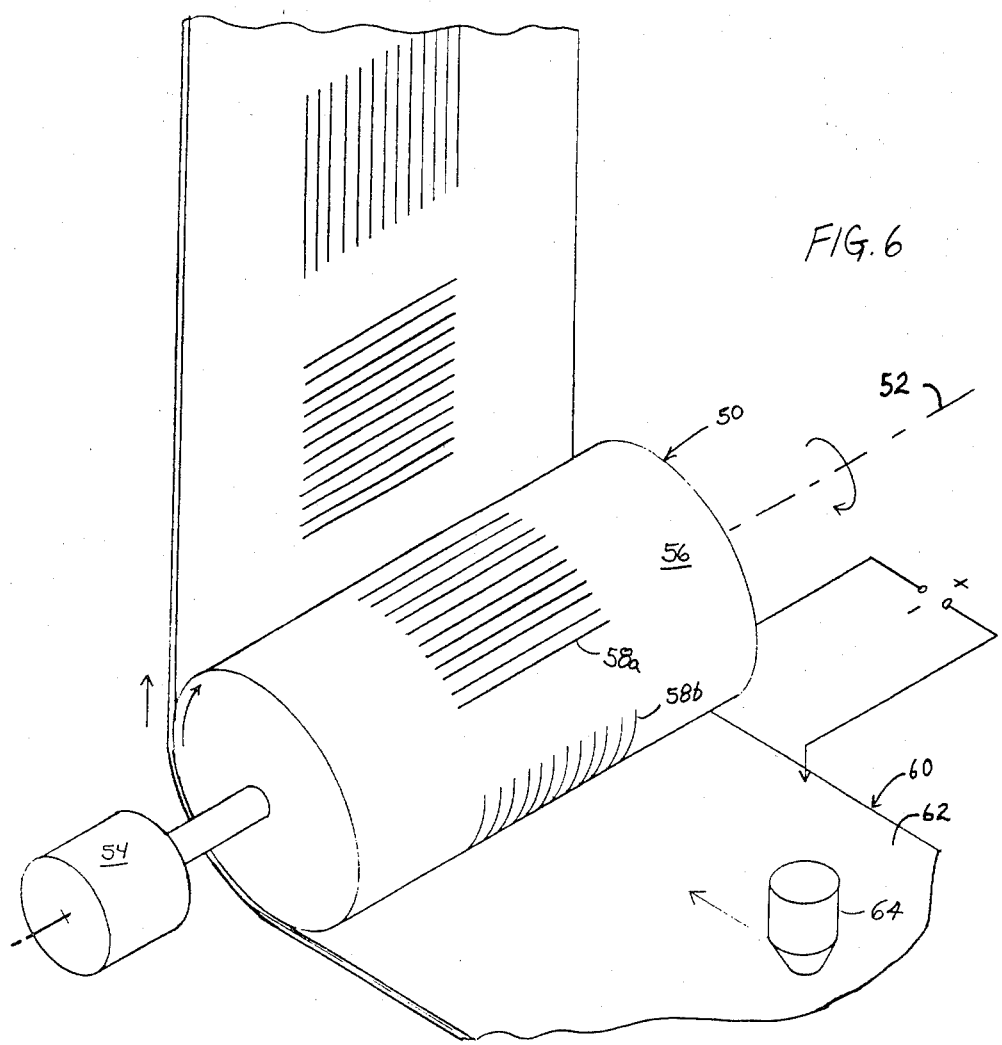

ELECTROCHEMICAL FORMATION OF THIN-FILM ELECTRODES

BACKGROUND OF THE INVENTION

The present invention relates to a method and apparatus for the making of thin-film electrode patterns, and more particularly, to the use of electrochemical reactions to pattern thin-film electrodes on a substrate carrying a film of electrode material.

Thin-film electrodes are used in various types of electronic devices including liquid crystal displays. In these types of devices, a layer of liquid crystal material is confined between a pair of spaced conductive members, at least one of which carries electrode material in the form of a pattern of thin-film electrodes. The electrodes are typically formed from a transparent conductive material, such as indium oxide or indium tin oxide. Various electrode patterns are used, including patterns that define numeric characters, alpha-numeric characters, and arrays of picture elements. The application of a voltage potential across selected areas of the electrode segments locally alters the orientation of the liquid crystal molecules to correspondingly alter the optical characteristics of the liquid crystal material and to achieve the desired optical display effect.

Various methods have been developed to deposit and selectively etch thin-films to define a desired electrode pattern. Using high vacuum deposition techniques, a film of conductive material is typically applied, uniformly across the surface of a substrate. The film can be deposited by, for example, thermal or electron-beam vacuum deposition, sputtering, or vapor plating. After deposition of the conductive film, a layer of photoresist material is applied and selectively exposed to ultraviolet or other appropriate radiation directed through an apertured mask that carries the desired electrode pattern. The resist polymerizes in the radiation exposed areas. After exposure, the unpolymerized resist, which corresponds to the unexposed areas, is removed using developing and/or washing solutions. The remaining polymerized resist can be subjected to further processing steps including chemical fixing, hardening, and heat treatment steps. The areas of the conductive film not covered by the fixed resist are etched with an acid to remove the unprotected conductive material. Subsequently, the remaining resist is removed to provide a substrate bearing the desired conductive electrode pattern. A variation of the photolithographic technique involves direct screen printing of the resist pattern onto the conductive film, this latter variation being used where precise dimensional tolerances are not required. Other pattern formation techniques include the direct deposition of the patterned electrode onto the substrate by deposition of the conductive material vapor through an appropriately apertured mask or spraying a chemical compound through a stencil with the chemicals reacting to form the appropriate electrode pattern.

The known processes for forming conductive electrode patterns have various advantages and disadvantages. In general, the photolithographic methods provide precisely formed electrodes. They require, however, many processing steps and are oftentimes associated with low yields, owing to delaminations and the adverse affects of such steps on conductivity, optical or electro-optic properties. On the other hand, the techniques which print the resist pattern or directly deposit the conductive material by plating through a mask or stencil generally do not produce precisely spaced, high resolution, high-acutance electrode patterns.

Liquid crystal displays have been used in increasing numbers as efforts have been made to reduce the manufacturing costs of these devices. In one approach, and disclosed in U.S. Pat. No. 4,228,574 to Culley et al, two elongated plastic preform strips are each prepared with electrodes and alignment layers. Adhesives seals are deposited onto one of the two preform strips to define the perimeter of each to-be-formed cell. Discrete quantities of liquid crystal material are deposited onto one of the strips in general registration with the adhesive seals and the two strips are joined together to form an elongated strip assembly of serially arranged cells. While the use of flexible plastic strips is conducive to automated production techniques, the electrode patterns must nonetheless be applied in a step-wise, non-continuous manner that limits the ultimate production efficiency of an automated manufacturing technique. Accordingly a need exists by which electrode patterns can be efficiently applied to an electrode bearing substrate in a manner conducive to automated production techniques.

SUMMARY OF THE INVENTION

In view of the above, the present invention provides a method and apparatus for the formation of thin-film electrodes on a substrate carrying a film of electrode material. A substrate is prepared by applying a uniform film of a desired electrode material or materials to the surface thereof. A pattern master is also prepared and carries upon its surface a pattern of insulated and conductive areas, with the insulated areas corresponding to the desired electrode pattern to be formed on the finished substrate. The pattern master and the substrate carrying the electrode film are brought together and into contact with an appropriate electrolyte solution between the confronting surface of the pattern master and substrate, to define an electrochemical cell in which the pattern master and the electrode film of the substrate function, respectively, as the cathode and the anode. A source of electrical energy (direct current) is connected between the pattern master and the electrode film of the substrate, with the resulting electrolytic action quickly removing selected areas of the electrode film corresponding to and opposite the conductive areas of the pattern master, while leaving unaffected, portions of the electrode film corresponding to and opposite the insulated areas of the pattern master. The finished substrate thus retains a desired electrode pattern corresponding to the insulated areas of the pattern master.

In one embodiment, the pattern master is formed from a conductive metal, such as aluminum or other preferably non-ferrous metal, having a planar surface upon which the master pattern is formed. The planar surface is coated with a photoresist, a desired pattern is imaged onto the photoresist to polymerize selected portions corresponding to the insulated areas of the resulting pattern master and the conductive electrode pattern on the finished substrate. The photoresist is treated in the usual manner to create a pattern master having selected conductive and insulated areas, with the insulated areas corresponding to the desired electrode pattern on the finished substrate. An electrode film is then applied to a substrate material, typically an elongated flexible plastic web or strip. The electrode film may be applied by various vapor deposition techniques including vacuum deposition, sputtering, and the like.

In a preferred embodiment, a multi-layer electrode film is formed comprising a sandwich of titanium dioxide ($TiO_2$), silver (Ag) and titanium dioxide. Alternatively, a minor amount of gold (Au), platinum (Pt) or palladium (Pd) can be alloyed with the silver or deposited as a separate layer to provide a measure of stability. The gold, platinum or palladium can be considered dopants or toners and may act to retard the reactivity of the silver and formation of oxides, halides, sulfides and the like reaction products, which may be detrimental to the conductivity of the conductive layer. The dopant material can be alloyed with the silver prior to deposition thereof onto the substrate or can be deposited as a separate layer with the silver layer or as a pair of sandwiching layers. The titanium dioxide layers typically employed in a sandwich electrode structure, while not conductive materials per se, do not negate conductivity of the electrode material and provide desirable improvements in the light transmission of the electrode material.

The pattern master and the substrate carrying the electrode film are brought into engagement with one another with an electrolyte solution interposed between the two confronting surfaces to define an electrochemical cell. The electrolyte is typically a solution of a salt and a non-aqueous solvent such as a medium-to-high boiling point organic liquid. A direct current potential is applied between the pattern master, which functions as the cathode, and the conductive electrode film of the substrate, which serves as the anode. The ensuing electrochemical reaction removes the silver from those areas of the conductive electrode film opposite the conductive areas of the pattern master to render the affected areas nonconductive and to, thus, provide a finished substrate with the desired conductive electrode pattern. In the case of silver, the electrochemical removal of silver may be considered an oxidation whereby metallic silver is changed to a more electropositive condition by removal of an electron, as indicated by the following oxidation half-cell reaction occurring at the anode:

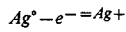

$$Ag^\circ - e^- = Ag^+$$

In another embodiment of the invention, well suited for continuous and automated methods for providing electrode-bearing substrates, a pattern master is defined as a rotatably mounted cylinder, drum or roll with conductive and insulated areas provided on the peripheral surface thereof, with the insulated areas corresponding to the desired electrode pattern on the finished substrate. An elongated strip or web having a previously applied conductive electrode film is brought into engagement with the periphery of the pattern master with an appropriate electrolyte solution interposed between the confronting surfaces. An electrical potential is applied between the pattern master and the electrode film of the substrate, the pattern master being rotated and the web substrate being advanced at respective rotary and linear velocities, so that the pattern master engages a corresponding area of the web substrate for a period of time sufficient to allow the electrochemical reaction between the two engaged surfaces to form the desired electrode pattern on the web substrate. Continuous operation of the pattern master results in spaced apart serially arranged electrode patterns on the web substrate.

The electrolyte solution used depends upon the materials of the conductive electrode film and the particular electrochemical reaction or mechanism by which the selected areas of the starting electrode film are removed. In general, the electrolyte will be a polar organic solvent such as is typically employed in electrochemical reactions and which is capable of dissolving a charge-carrier or conductive salt and which allows the desired electrochemical removal of conductive electrode film to be accomplished. Typically the solvent will be a medium-to-high boiling organic liquid taken from any of a variety of classes, including such amides as dimethylformamide and the long-chain amides (e.g., N,N-diethyl dodecanamide); amines such as the long-chain amines (e.g., n-dodecylamine); alcohols; ethers such as dioxane, polyethylene glycol or tetrahydrofuran; esters such as diethyl phthalate, di-(2-ethylhexyl)-sebacate; dimethylsulfoxide; and N-methylpyrrolidone.

The charge-carrier or conductive salt used in the electrolyte can vary and, in general, will be an ionic salt capable of being dissolved in the electrolyte solvent employed and of supporting the electrolytic reaction. Suitable ionic or ionizable compounds for this purpose are the salts of strong acids having as cations such cations as the alkali metal cations (e.g., sodium, potassium or lithium); and the onium cations, such as ammonium, phosphonium, oxonium and arsonium. Among anions of such supporting electrolyte salts are the halide anions (e.g., chloride bromide or iodide); nitrate; sulfate and sulfonate anions (e.g., benzenesulfonate and tosylate); and carboxyl-containing anions (e.g., benzoate). Other cations and anions such as are typically employed in electrochemical reactions can be employed, provided that they support the desired electrochemical method hereof and do not unacceptably exhibit a deleterious effect on the physical or electro-optic properties of the pattern master, the substrate to be patterned, the electrode film thereof or the finished electrode pattern. In general, the conductive salt will be employed in the electrolyte solvent at a concentration in the range of from about 0.075% to about 1% by weight, and preferably at a concentration of about 0.125% to 0.25% weight. Suitable concentrations will be dependent upon the particular salt and solvent materials employed.

A preferred class of conductive salts comprises the quaternary nitrogen-containing salts of the formula

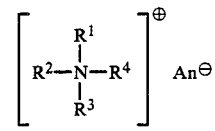

wherein each of $R^1$, $R^2$, $R^3$ and $R^4$ is independently hydrogen, alkyl of 1 to 6 carbon atoms, cycloaliphatic of from 6 to 14 carbon atoms (e.g., cyclohexyl), aryl of from 6 to 14 carbon atoms (e.g., phenyl), alkaryl (e.g., tolyl), aralkyl (e.g., benzyl), or wherein at least two of $R^1$, $R^2$, $R^3$ and $R^4$ together comprise the atoms to complete a nitrogen-containing heterocyclic ring such as pyridinium or morpholinium, and An $\ominus$ represent an anion such as halide (e.g., chloride, bromide or iodide); sulfate, sulfonate and nitrate. Examples of such salts are the tetramethylammonium, the tetrabutylammonium, and the 1-ethylpyridinium chloride, bromide, iodide and nitrate salts. These salts are readily solubilized in a preferred electrolyte solvent such as diethyl dodecanamide and permit the desired electrolytic reaction to proceed with good results.

If desired, the electrolyte can contain, in addition to the components hereinbefore described, certain additives to suit a particular purpose. For example, viscosity-increasing agents or thickeners, to improve the rheology or application of the electrolyte composition between the electrodes, can be used. Organic ligands or chelating agents can be incorporated, particularly where the starting conductive film comprises silver, so as to make the electrolytic dissolution of silver more efficient, by ensuring that the presence of silver ion in solution does not adversely affect the desired equilibrium of reaction. Suitable compounds for this purpose include such organic ligands and chelating agents as the uracils, e.g., methyl uracil and thiomethyl uracil; cyclic sulfones; ethylenediamine tetraacetic acid and the salts thereof; alkyl dithiol; or mixtures thereof.

The present invention thus provides a method and apparatus by which electrode patterns can be provided on electrode bearing substrates, such as are used in liquid crystal displays, in such a manner that the electrode patterns can be formed quickly and efficiently and in a manner compatible with automated production techniques.

A principal objective of the present invention is, therefore, the provision of an improved method and apparatus for the electrochemical patterning of electrode material on a substrate. Other objects and further scope of applicability of the present invention will become apparent from the detailed description to follow, taken in conjunction with the accompanying drawings, in which like parts are designated by like reference characters.

BRIEF DESCRIPTION OF THE DRAWINGS

FIG. 6 is an isometric view of continuous processing apparatus for continuously forming electrode stripe patterns on a web substrate.

DESCRIPTION OF THE PREFERRED EMBODIMENT

Figure 1:
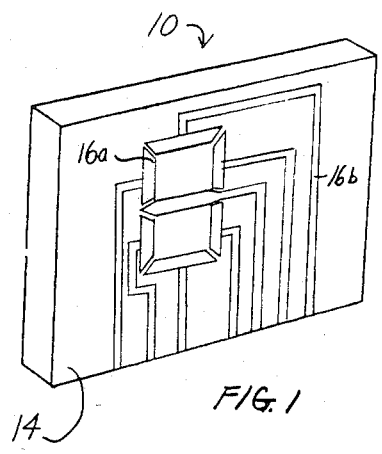
FIG. 1 is an isometric view of a pattern master bearing an exemplary multi-segment electrode pattern.
Figure 2:
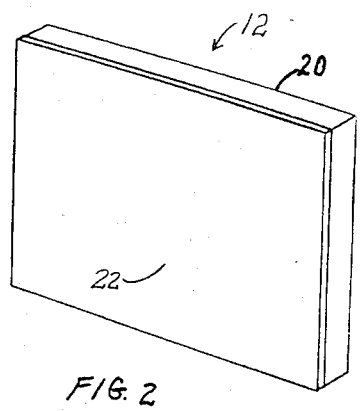
FIG. 2 is an isometric view of a substrate having a conductive film formed on one surface.

In accordance with the present invention, and as shown in FIGS. 1 and 2, a pattern master 10 cooperates with a substrate material 12 to create a conductive electrode pattern on the substrate 12. The pattern master 10 is formed from a conductive material, preferably a nonferrous metal such as aluminum, and includes a surface 14 which carries both conductive and non-conductive (or insulated) areas that define an electrode pattern. The pattern master 10 can be formed of other conductive materials such as chromium, cooper, nickel, nichrome or stainless steel. If desired, the pattern master can be formed using a block of aluminum, chromium, nickel or like metal. Alternatively, a block of insulator material such as plastic or glass having a metallic foil adhered thereto can be used. In the case of the illustrated embodiment, the pattern master 10 is formed as a rectangular block with the generally planar surface 14 carrying insulated areas 16a which define a conventional 7-segment numeric display electrode pattern and insulated areas 16b which represent connection traces for the individual segments. The 7-segment numeric electrode pattern of FIG. 1 is exemplary and other electrode patterns can be used, including line patterns such as are employed in the production of dot matrix displays, numeric and alpha-numeric character patterns and any of a variety of non-character electrode patterns.

The pattern master 10 is preferably formed using photolithographic techniques although other methods and processes are suitable. The surface 14 is first coated with a photoresist material such as a dichromated gelatin or other polymerizable photoresist material. Suitable photoresist materials are known in the art and include the commercially available negative- and positive-working photoresist materials. In the case, for example, of a negative-working photoresist, those areas of the photoresist-coated surface 14 corresponding to the desired electrode pattern areas 16a and 16b are exposed to UV radiation or other electromagnetic radiation or ion-beam irradiation to polymerize or otherwise cross-link and harden the exposed photoresist. Exposure is preferably effected by use of an appropriately apertured mask or masks, as in known in the art. The unexposed and unpolymerized photoresist is removed using suitable developer and/or washing solutions. The remaining hardened photoresist, which adheres to the surface 14, and which is electrically insulating, can be subjected to further post-exposure steps including additional fixing, hardening, or heat treating steps. The surface 14 of the resulting pattern master 10, thus, includes areas of insulating photoresist 16a and 16b, corresponding to the desired electrode pattern on the finished electrode bearing substrate, and the uncoated conductive surface 14 of the material from which the pattern master 10 is fabricated.

While the production of pattern master 10 has been described by reference to a negative-acting photoresist material (where exposed areas become insoluble while unexposed areas remain soluble and removable in a developing solution), it will be appreciated that the pattern master 10 can also be prepared by resort to photolithographic methods based on known positive-acting photoresist materials. In the case of a positive-acting photoresist material, areas exposed to radiation become soluble and removable in a developing solution, while unexposed areas (corresponding to the pattern areas 16a and 16b of pattern master 10 and to the final desired electrode pattern) remain insoluble. In some instances, a positive-acting resist may allow for better resolution than a negative-acting counterpart, and depending upon the particular pattern desired in the pattern master (and correspondingly in the finished electrode pattern), a positive-acting photoresist material may be the photoresist material of choice.

The substrate 12 is formed from a base material 20, such as glass or plastic, carrying a layer of film 22 or conductive material deposited or otherwise formed onto the surface thereof. Suitable plastics include flexible substantially transparent polymeric materials such a polyethylene terephthalate or other polyester; polyether sulfone; polycarbonates; cellulose esters such as cellulose triacetate and cellulose acetate butyrate; and vinyl polymers such as the acrylics. The particular nature of base material 20 of substrate 12 will depend oftentimes upon the particular structure desired in a display device and upon the electro-optical and performance requirements of the device. Base material 20 may comprise single or multiple layers. According to a preferred embodiment, base material 20 will be a light-polarizing plastic sheet or web material comprising a plastic sheet material, such as polyethylene terephthalate, carrying a layer (not shown) of light-polarizing material. The light-polarizing material can be laminated to base material 20 by means of an intermediate transparent adhesive and, generally, will comprise a linear dichroic light-polarizing material having a thickness in the range of about 0.1 to 3 mils. (about 0.0025 to 0.076 mm.).

A preferred material to serve as the light-polarizing layer is a unitary layer of stretched (oriented) polyvinyl alcohol of about one-mil thickness (0.025 mm.) stained according to know methods with a dichroic dye such as iodine. Such a polarizing material will also be preferably borated for improved stability. Suitable polarizing layers of this type can be prepared utilizing methods set forth in U.S. Pat. No. Re. 23,297 and in U.S. Pat. No. 4,166,871. Another preferred polarizing material is a stretched polyvinyl alcohol sheet containing polyvinylene light-polarizing species such as may be provided by hydrochloric acid vapor processing in known manner. Preferably, such polarizing material will be borated for improved stability. Suitable methods for the production of such polarizing materials are described in U.S. Pat. No. 2,445,555. The polarizing layer can be readily bonded to base 20 which provides primary mechanical support for substrate 12. The transparent adhesive used to affix the light-polarizing layer to the base material 20 should be selected for environmental stability and for adherency to both the base material and the light-polarizing layer. Suitable adhesives include polyvinyl alcohol and urethane-based adhesive materials.

If desired, base material 20 can include, in addition to the light-polarizing layer, a protective barrier layer therefor (not shown). The protective layer, which will generally be of a thickness in the range of 0.10 micron and 20 micron can be applied to the light-polarizing layer prior to deposition of electrode film material 22. The protective layer, while not essential, can serve important barrier functions in protecting the conductive electrode material 22 from possible corrosive or degradative influences of the light-polarizing layer, and in preventing the contamination of the liquid crystal material in a display device by components of the light-polarizing layer. In addition, the protective barrier layer serves to protect the light-polarizing layer against the effect of the liquid crystal material which may not be chemically compatible therewith. The protective layer can comprise polyvinyl alcohol, polyvinylidene chloride, polyvinyl acetal, or a fluorinated polymer such as is disclosed in U.S. Pat. No. 4,006,814. A preferred material is polyvinylidene chloride.

The starting film 22 is formed from the material or materials that define the electrode pattern of the finished substrate. In a preferred embodiment, the starting film 22 is a titanium dioxide, silver, titanium dioxide composite. The use of a starting film 22 of silver, sandwiched between layers of the high index of refraction dielectric material (titanium dioxide) permits the production therefrom of electrode patterns having good light transmission properties. A preferred titanium dioxide/silver/titanium dioxide arrangement of layers can be suitably deposited onto base material 20 by vacuum deposition technique. For example, a preferred web material comprising biaxially oriented polyethylene terephthalate carrying a layer of light-polarizing material (and optionally, a protective barrier layer) can be passed in a series of successive passes over vapors of titanium dioxide, silver and titanium dioxide, respectively, so as to deposit the desired layers. As mentioned previously, gold or platinum may be alloyed with the silver or deposited on either or both sides of the silver layer, also by known vacuum deposition methods. Since the starting film 22 will form the finished electrode pattern, the starting film 22 should be thin enough or otherwise arranged to be substantially transparent to visible light and the silver constituent should be sufficiently thick to provide the desired conductivity.

Figure 3:
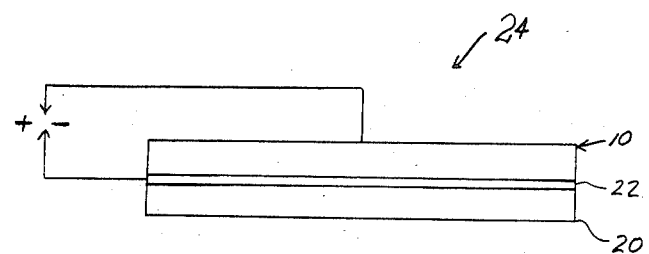
FIG. 3 is an end view of the pattern master of FIG. 1 and the substrate of FIG. 2 in engagement with one another to form an electrochemical cell.

In order to form the finished electrode pattern on the substrate 12, the pattern master 10 and the substrate 12 are brought together with the surface 14 engaging the starting film 22, as shown in side elevation in FIG. 3. An electrolyte (not specifically shown) is placed between the confronting surfaces of the pattern master 10 and the substrate 12 to define an electrolytic cell 24 in which the pattern master 10 functions as the cathode and the starting film 22 functions as the anode. The composition of the electrolyte will depend upon the conductive material constituent or constituents of the starting film 22. In the case of starting film 22 in which silver is the predominant conductive material, it will be preferred to employ a non-aqueous electrolyte salt solution comprising a solvent having a medium-to-high boiling point, such as a dialkyl ester or a long-chained amine or amide, and a conductive salt as previously described. The concentration of the conductive salt in the electrolyte solvent can vary. Thus, a low concentration of electrolyte salt may be required in the production of a complex, high resolution pattern to assure good sharpness, clarity and acutance. Good results can be obtained, for example, at concentrations of about 0.25% by weight. Depending upon the nature of the pattern to be produced, it may be desirable to employ the conductive salt at a high-to-saturated concentration. Satisfactory results are obtained, for example, using an electrolyte of diethyl dodecanamide saturated with tetrabutyl ammonium iodide. The concentration of salt may also be dictated in part by the rate at which electrode material is desirably removed in the electrolytic patterning process.

In patterning substrate 12, electrolyte is applied between pattern master 10 and the substrate 12 to insure complete filling or coverage of the confronting surface areas. In practice, a small gap will exit between the two confronting surfaces. The gap between the electrodes will depend upon the concentration of electrolyte salt, the viscosity and rheology of the electrolyte, the amount of pressure applied to the outside surfaces of the electrodes and the thickness of the insulated areas on the pattern master. Good electrode patterning can be accomplished by maintaining intimate contact between the electrodes and the electrolyte therebetween at a small gap maintained by slight pressure applied to the outer surface of the respective electrodes.

Figure 4:
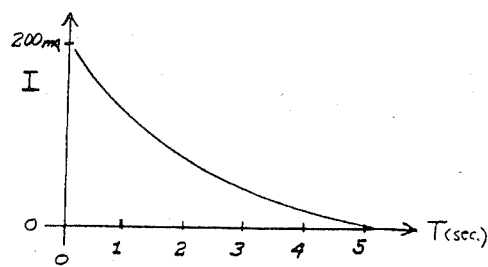
FIG. 4 is an idealized, qualitative graph of electrical current relative to time for the electrochemical cell of FIG. 3.
Figure 5:
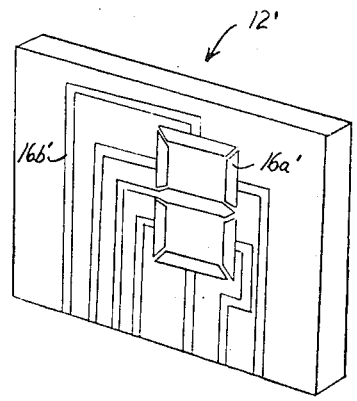
FIG. 5 is an isometric view of the substrate of FIG. 2, bearing a conductive electrode pattern corresponding to the electrode pattern of the pattern master of FIG. 1.

The pattern master 10 and the starting film 22 are connected to a source of direct current potential, as shown in FIG. 3, with the pattern master 10 functioning as the cathode and the starting film 22 functioning as the anode. Good results can be obtained using a fixed potential of from 10 to 25 volts DC provided from a voltage regulated power supply. The voltage can vary, however, and will depend upon the particular electrode and electrolyte materials employed, particularly the concentration of electrolyte salt, and on the rate at which the electrolytic patterning is desirably accomplished. As indicated in a qualitative manner in FIG. 4, an initial current flow (e.g., 200 ma at time zero) will be observed to diminish rapidly. After five seconds or so, the current flow diminishes to almost zero. During the time period that current is flowing, the silver constituent of the starting film 22 is electrolytically removed (i.e., oxidized) and transported from those surface areas of the starting film 22 immediately opposite the conductive areas of the pattern master 10, leaving (as shown in FIG. 5) a finished substrate 12' having conductive areas 16a' and 16b' immediately opposite the insulated surface areas 16a and 16b of the pattern master 10 to thus provide the desired finished electrode pattern.

If desired, the electrochemical cell can be operated at an initial and predetermined fixed current (e.g., 90 ma), the initial voltage (e.g., 10 volts) increasing as the reaction proceeds, until a predetermined voltage (e.g., 25 volts) is reached. Other operating conditions can, however, be used, depending upon the particular materials and the desired pattern involved.

The temperature at which the electrochemical patterning method is conducted is not critical and can vary depending, for example, upon the nature of the conductive electrode material and electrolyte employed. In general, the temperature should not be such as to have an adverse influence on the substrate materials, such as those of plastic, and should not exceed the boiling point of the electrolyte solvent. Similarly, the temperature should not be allowed to be lowered to the point of causing the salting-out of electrolyte from the electrolytic medium. In general, good results are obtained the range of about 15° C. to 35° C., although it will usually be preferred to operate at room temperature.

The nature of the electrochemical cell 24 presents a number of operational advantages since relatively precise monitoring of the electrochemical mechanism can be achieved by monitoring the current flow, and the process is inherently self-extinguishing, that is, the current flow drops to zero or near zero at the completion of the formation of the electrode pattern on the substrate 12. The upper time limit for electrode pattern formation is not strictly time critical, and completion of the pattern operation can be determined by monitoring current flow. Nonetheless, continued application of a voltage potential (or driving the reaction at too high a potential) should be avoided, so as to avoid loss of sharpness and acutance caused by undercutting or sideways flow of ions or electrons.

After the electrolytic reaction is completed, the pattern master 10 and the substrate 12 are separated and the electrolyte is removed by washing with a suitable solvent such as acetone. The resulting electrode pattern is a faithful replica of that of the pattern master 10. The stability of the remaining conductive material which forms the finished electrode pattern does not appear to be degraded.

The method described above for the formation of electrode patterns on substrates can be applied in a continuous processing environment to produce electrode pattern bearing substrates in a time and cost efficient manner. As shown in FIG. 6, a cylindrical pattern drum 50 is mounted for rotation in the direction indicated about its longitudinal axis 52 by a drive motor 54. The pattern drum 50 is either fabricated from a conductive material, such as aluminum or other non-ferrous metal, or has a conductive peripheral surface 56. In the illustrated embodiment, two different electrode patterns, 58a and 58b, are provided about the peripheral surface 56 of the pattern drum 50. The electrode pattern 58a is defined by closely spaced parallel lines (about 250 lines per inch) of insulating material aligned parallel to the longitudinal axis 52 of the pattern drum 50. The electrode pattern 58b is defined, in a similar manner, by closely spaced parallel lines of insulating material aligned orthogonal to the lines of the electrode pattern 58a. The electrode patterns 58a and 58b, in the assembled light crystal cell, are crossed at right angles relative to one another to define an addressable picture element at the intersection of each pair of electrode lines. The electrode patterns 58a and 58b on the peripheral surface 56 of the pattern drum 50 may be formed using the photolithographic techniques described above.

An elongated web 60 of a strong flexible polymeric material, which can be provided with polarizing properties, is provided with a starting film 62 on one surface of the web 60. As described above, a titanium dioxide, silver, titanium dioxide composite is preferred for the starting film 62 with the constituents applied in the manner described for the substrate 12. Elongated web 60 is guided so that the starting film 62 engages the peripheral surface 56 of pattern drum 50 and is tensioned to maintain firm contact between the confronting surfaces. If desired, other devices (not shown) may be provided to assist in maintaining contact between the peripheral surface 56 of the pattern drum 50 and the starting film 62 of the web 60.

The pattern drum 50 is rotated about its axis 52 and the web 60 is advanced so that the tangential velocity of the peripheral surface 56 of the pattern drum 50 and the linear velocity of the web 60 are identical, so that there is no relative movement between the two confronting surfaces. The electrolyte can be applied to the web 60 in advance of the web 60 engaging the pattern drum 50 to assure an ample supply of electrolyte for the ensuing electrochemical reaction. For example, a nozzle 64 (shown in schematic fashion) can be provided to direct a supply of electrolyte onto the starting film 62 in advance of the nip defined between the pattern drum 50 and the web 60 to assure an oversupply of electrolyte. The pattern drum 50 is connected to a source of electrical energy through conventional connection devices, for example, slip rings (not shown) and the starting film 62 similarly connected through a brush type or roller type contact or contacts (not shown). The engaged surfaces of the pattern drum 50 and the web 60, during the time they are in engagement, define an electrochemical cell in a manner analogous to the electrochemical cell 24 of FIG. 3.

In operation, the pattern drum 50 is rotated and the web 60 advanced at respective rotary and linear velocities to insure sufficient time for the electrochemical removal of the conductive constituents of the starting film 62 opposite the conductive areas of the pattern drum 50, to electrochemically create the desired electrode pattern on the web 60 in the manner described above. The finished web 60 is subjected to one or more washing or cleaning steps and can be used with another similarly processed web 60 to manufacture liquid crystal displays in the manner described in the now abandoned U. S. patent application of Leonard Polizzotto, Ser. No. 564,751, filed Dec. 22, 1983 and in the U. S. patent application of Stewart Bennett, Ser. No. 564,753, filed Dec. 22, 1983 and now U.S. Pat. No. 4,674,840.

According to an alternative to the embodiment illustrated in FIG. 6, web 60 can be passed into a suitable electrolysis vessel containing an electrolyte bath and pattern drum 50 can be brought into contact with surface 62 of web 60 while the web traverses through the bath. The bath process assures a supply of electrolyte sufficient to contact the entire surface area between the web surface 62 and pattern drum 60 and avoids the requirements of a nozzle means 64. Upon emergence of web 60 from the bath after completion of the electrolytic pattern process, the web is washed and used in the manufacture of displays as previously described.

As can be appreciated from the above, the present invention provides for the relatively time and cost efficient fabrication of electrode patterns on substrate carrying electrode material, and in a manner that is conducive to continuous manufacturing techniques.

The invention will now be described further in detail with respect to specific preferred embodiments by way of example, it being understood that these are intended to be illustrative only and the invention is not intended to be limited to the materials, conditions and process parameters which are recited therein.

EXAMPLE 1

A pattern master was prepared from a positive-working photoresist material and an aluminum plate in the following manner.

A layer of photoresist material (Hunt 256 Positive Resist System, from Philip A. Hunt Chemical Corp., West Patterson, N.J.) was applied by spin coating to the surface of a smooth aluminum plate, at a thickness in the range of two to four microns. After a pre-bake for 30 minutes at 90° C., the coating was exposed for 90 seconds (through an apertured line-pattern mask) to ultraviolet irradiation of 350–450 nm wavelength. The exposed coating was developed for 30 seconds in Hunt 427 Resist Developer and was rinsed with water. After drying, the coating was baked at 180° C. for 30 minutes to provide a pattern of lines comprising about 250 lines per inch (one line per mm.)

The pattern master was used to provide an electrode pattern, on a substrate (the pattern corresponding to that of the master) in the following manner. A sheet of flexible polyester material (polyethylene terephthalate) carrying a starting film of electrode material was provided by vacuum depositing onto the polyester material, a first layer of titanium dioxide (500 Å); a layer of silver (100 Å); a layer of gold (15 Å); and a second layer of titanium dioxide (500 Å). The resulting polyester sheet (carrying the starting electrode material) was designated the anode (working) electrode for a DC-driven cell; and the pattern master was designated the cathode. The electrolytic cell was made by applying a thin layer of electrolyte solution (a 0.25 wt. % solution of tetra-n-butylammonium chloride in diethylphthalate) to the surface of the anode, bringing the surface of the cathode into engagement with the anode surface, with the electrolyte therebetween, and applying a DC voltage of ten volts, using a voltage-regulated power supply connected across the anode and cathode. The cell was driven at room temperature for ten seconds. The electrolyte reaction which occurred was monitored by measuring current flow through the cell. A maximum current of 250 milliamps was measured during the initial stage of the electrolytic reaction and was observed to drop quickly to less than 25 milliamps, and finally to zero, indicating a break in conductivity. The patterned polyester substrate was separated from the pattern master and washed with acetone for removal of the electrolyte solution from the surface thereof. Inspection of the patterned polyester substrate showed removal of conductive material from all areas opposite the conductive areas of the pattern master and production of a conductive electrode pattern corresponding to the insulated areas of the pattern master. Removal of conductive material and the non-conductivity of areas where the starting electrode material was removed from the polyester substrate were confirmed by plasma emission analysis.

EXAMPLE 2

A substrate material having light-polarizing properties and a seven-segment numeric electrode pattern thereon was provided in the following manner.

A dichroic light-polarizing layer of stretched (oriented) polyvinyl alcohol dyed with iodine and borated was adhesively bonded to a sheet of polyethylene terephthalate. Electrode material (to be patterned) was applied to the light-polarizing layer and comprised a first layer of titanium dioxide (500 Å), a layer of silver (100 Å), a layer of gold (15 Å) and a second layer of titanium dioxide (500 Å), each of the electrode layers being applied in the manner described in EXAMPLE 1.

Using the method described in EXAMPLE 1 for the production of the pattern master thereof, and an appropriate mask, a pattern master having a seven-segment numeric pattern of insulated polymer, in lieu of a line pattern, was prepared on a smooth aluminum plate. An electrolyte cell was prepared by bringing the substrate material carrying the electrode material (the anode) and the pattern master (the cathode) into engagement, with an electrolyte solution therebetween, in the manner described in EXAMPLE 1. The electrolysis reaction was performed substantially as described therein, and upon separation of the engaged electrodes and washing with acetone, there was provided a light-polarizing element having thereon a seven-segment numeric pattern corresponding to the insulating areas of the pattern master. Each of the seven segments were observed to be individually addressable, indicating that only desired areas remained electrically conductive while other areas were rendered non-conductive by the electrolytic removal of electrode material. Non-conductive areas were confirmed to be such by plasma emission analysis.

EXAMPLE 3

The continuous patterning of an elongated web was accomplished in the following manner. An elongated web (polyethylene terephthalate having light-polarizing and electrode material layers as described in EXAMPLE 2) was taken from a supply roll and passed into an electrolyte bath comprising 0.25 wt.% of tetra-n-butylammonium nitrate in N,N-diethyl dodecanamide. The web was passed into the bath with the side of the web carrying the electrode material facing downwardly. A cathode comprising a glass plate having a layer of aluminum and a photolithographically applied pattern (an alpha-numeric pattern of insulative polymer) was positioned in the electrolytic bath with the patterning surface facing upwardly. As the web was immersed in the electrolyte solution and traversed over the area of the patterning cathode, the electrode surface of the web was brought into flat engagement with the cathode by the application of gentle force to the opposed surface of the web, using a flat plate (to assure uniform contact between the cathode and the web surface to be patterned). The electrolytic patterning was accomplished using a regulated DC power supply, operated at variable voltage to provide an initial and fixed current flow of 90 milliamps (about 10 volts). Voltage was observed to increase to about 25 volts, whereupon the power was shut off, all within about three to ten seconds for completion of the electrolytic patterning. The pressure applying member was withdrawn, the web was traversed into a washing bath for removal of electrolyte solution, dried and taken onto a take-up roll. In the manner described, a series of incrementally spaced patternings can be accomplished on an elongated web by contacting successive and spaced areas of the web with the patterning electrode. The web can then be washed and dried and severed into electrode-bearing segments for use in the fabrication of electro-optic display devices.

EXAMPLE 4

An elongated web material of the composition described in EXAMPLE 3 was patterned, using a rotatable cylinder carrying a patterning surface, in the following manner. A pattern in polymeric insulative material was photolithographically applied in known manner to the surface of an aluminum cylinder. The surface of the elongated web carrying the electrode material was brought into engagement with the patterned surface of the cylinder. The cylinder, electrically isolated from apparatus used to rotate the cylinder, was made the cathode; and the conductive surface of the elongated web was made the anode of a DC-driven cell. At the point of contact between the web and the cylinder, a salt solution (0.25 wt.% of tetra-n-butylammonium iodide in N,N-diethylodecanamide) was introduced to serve as electrolyte for the cell. The web was moved at a rate of ten feet per minute (3 meters/min.) and a potential of 20 volts DC was applied across the cathode and anode. Current was observed to be in the range of 300 to 400 milliamps. Upon separation of the patterned web from the cylinder and washing with acetone for electrolyte removal, the design pattern on the surface of the cylinder was observed on the surface of the elongated web. Areas corresponding to insulating areas on the cylinder remained conductive on the web; and areas corresponding to conductive areas on the cylinder were no longer conductive on the web.

Thus, it will be appreciated from the above, that as a result of the present invention, highly effective method and apparatus for the formation of electrode patterns is provided by which the principal objective, among others, is completely fulfilled. It will be equally apparent and is contemplated that modification and/or changes may be made in the illustrated embodiments without departure from the invention. Accordingly, it is intended that the foregoing description and accompanying drawings be illustrative of preferred embodiments only, not limiting, and that the true spirit and scope of the present invention be determined by reference to the appended claims.

What is claimed is:

1. A method for forming a predetermined pattern of thin-film transparent electrodes on a substrate, comprising the steps of:
   providing a starting film comprising silver electrode material on a first substrate, said starting film being substantially transparent to visible light;
   providing a pattern-forming surface on a second substrate, said pattern-forming surface defining conductive areas and insulated areas, the insulated areas corresponding to a predetermined electrode pattern to be defined on said first substrate;
   bringing the starting film of silver electrode material on said first substrate and the pattern-forming surface of said second substrate into confronting relationship, with a non-aqueous electrolyte therebetween, said non-aqueous electrolyte comprising an organic solvent having therein a conductive salt capable of supporting an electrolytic reaction therebetween;
   passing an electrical current between the conductive areas of said pattern-forming surface and the silver starting film, to electrochemically remove areas of silver electrode material from said first substrate corresponding to the conductive areas of said pattern-forming surface, while leaving on said first substrate areas of silver electrode material corresponding to the insulated areas of said pattern-forming surface, thereby to define said predetermined pattern of thin-film transparent electrodes on said first substrate.

2. The method of claim 1 wherein said first substrate comprises a polymeric sheet material.

3. The method of claim 2 wherein said polymeric sheet material is polyethylene terephthalate.

4. The method of claim 1 wherein said starting film comprises a layer of silver sandwiched between a pair of titanium dioxide layers.

5. The method of claim 1 wherein said first substrate comprises a light-polarizing sheet material.

6. The method of claim 5 wherein said light-polarizing sheet material comprises a polymeric support sheet carrying a dichroic light-polarizing layer.

7. The method of claim 6 wherein said dichroic light-polarizing layer is an iodine-stained and borated stretched layer of polyvinyl alcohol.

8. The method of claim 6 wherein said dichroic light-polarizing layer is a stretched polyvinyl alcohol sheet containing polyvinylene light-polarizing species.

9. The method of claim 1 wherein said conductive salt is tetra-n-butylammonium nitrate.

10. The method of claim 1 wherein said pattern-forming surface on said second substrate is provided by a pattern of insulating polymeric material on a conductive metallic substrate.

11. The method of claim 10 wherein said metallic substrate comprises aluminum and said pattern of insulating polymeric material is applied photolithographically from a polymeric photoresist.

12. The method of claim 1 wherein said conductive salt is a compound having the formula

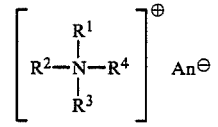

wherein each of $R^1$, $R^2$, $R^3$ and $R^4$ is independently hydrogen, alkyl of 1 to 6 carbon atoms, cycloaliphatic of from 6 to 14 carbon atoms, aryl of from 6 to 14 carbon atoms, alkaryl, aralkyl, or wherein at least two of $R^1$, $R^2$, $R^3$ and $R^4$ together comprise the atoms to complete a nitrogen-containing heterocyclic ring, and An $\ominus$ represents an anion.

13. A method for forming a predetermined pattern of thin-film transparent electrodes on an elongated web, comprising the steps of:

providing an elongated web having a starting film comprising silver electrode material thereon, said starting film being substantially transparent to visible light;

providing a rotatably mounted patterning surface having conductive areas and insulated areas, the insulated areas corresponding to a predetermined electrode pattern to be defined on said elongated web;

rotating the patterning surface and advancing the elongated web into engagement with said patterning surface;

supplying a non-aqueous electrolyte between the engaged web and patterning surface, said non-aqueous electrolyte comprising an organic solvent having therein a conductive salt capable of supporting an electrolytic reaction therebetween; and passing an electrical current between the conductive silver areas of said patterning surface and the silver electrode material of said starting web, to electrochemically remove areas of silver electrode material from said web corresponding to the conductive areas of said patterning surface, while leaving on said web, areas of silver electrode material corresponding to the insulated areas of said patterning surface, thereby to define said pattern of thin-film transparent electrodes on said elongated web.

14. The method of claim 13 wherein said elongated web comprises a web of polyethylene terephthalate carrying a dichroic light-polarizing layer.

15. The method of claim 13 wherein said rotatably mounted patterning surface is provided by a cylindrical drum fabricated from a non-ferrous metal and mounted for rotation about an axis, the peripheral surface of said drum defining a patterning surface having conductive areas and insulated areas, said conductive areas corresponding to peripheral surface areas of said non-ferrous metal and said insulated areas corresponding to said predetermined electrode pattern.

16. The method of claim 15 wherein said non-ferrous metal is aluminum and said insulated areas comprise polymeric material applied photolithographically from a polymeric photoresist.

17. The method of claim 13 wherein said starting film comprises a layer of silver sandwiched between a pair of titanium dioxide layers.

18. The method of claim 1 wherein said non-aqueous electrolyte includes an organic ligand or chelating agent.

19. The method of claim 13 wherein said non-aqueous electrolyte includes an organic ligand or chelating agent.

* * * * *